United States Patent
Kim et al.

(10) Patent No.: US 9,830,982 B2
(45) Date of Patent: Nov. 28, 2017

(54) NEUROMORPHIC MEMORY CIRCUIT USING A DENDRITE LEAKY INTEGRATE AND FIRE (LIF) CHARGE

(71) Applicant: International Business Machines Corporation, Armonk, NY (US)

(72) Inventors: SangBum Kim, Yorktown Heights, NY (US); Chung H. Lam, Peekskill, NY (US)

(73) Assignee: International Business Machines Corporation, Armonk, NY (US)

( * ) Notice: Subject to any disclaimer, the term of this patent is extended or adjusted under 35 U.S.C. 154(b) by 335 days.

(21) Appl. No.: 14/749,413

(22) Filed: Jun. 24, 2015

(65) Prior Publication Data

US 2016/0203400 A1    Jul. 14, 2016

Related U.S. Application Data (63) Continuation of application No. 14/596,223, filed on Jan. 14, 2015.

(51) Int. Cl.
| | |
|---|---|
| *G06F 15/18* | (2006.01) |
| *G11C 11/54* | (2006.01) |
| *G06N 3/063* | (2006.01) |
| *G11C 11/56* | (2006.01) |
| *G11C 13/00* | (2006.01) |
| *G06N 3/04* | (2006.01) |
| *G06N 3/08* | (2006.01) |

(52) U.S. Cl.
CPC ............ *G11C 11/54* (2013.01); *G06N 3/049* (2013.01); *G06N 3/063* (2013.01); *G06N 3/088* (2013.01); *G11C 11/5678* (2013.01); *G11C 13/0002* (2013.01); *G11C 13/0004* (2013.01)

(58) Field of Classification Search
CPC ........................................................ G06N 3/04
USPC ..................................................... 706/12, 45
See application file for complete search history.

(56) References Cited

U.S. PATENT DOCUMENTS

| | | | |
|---|---|---|---|
| 8,447,714 B2 | 5/2013 | Breitwisch et al. | 706/33 |
| 8,589,320 B2 | 11/2013 | Breitwisch et al. | 706/15 |
| 8,682,822 B2 * | 3/2014 | Modha | G06N 3/049 706/25 |

(Continued)

*Primary Examiner* — David Vincent
(74) *Attorney, Agent, or Firm* — Ido Tuchman; Louis J. Percello (57) ABSTRACT

A method for operating a neuromorphic memory circuit. The method includes accumulating a dendrite LIF charge over time on a conductive dendrite LIF line. A first transmitting operation transmits an axon LIF pulse on a conductive axon LIF line. A first switching operation switches on a LIF transistor by the axon LIF pulse such that the LIF transistor provides a discharge path for the dendrite LIF charge through a programmable resistive memory element when the axon LIF line transmits the axon LIF pulse. A second transmitting operation transmits a dendrite STDP pulse if the dendrite LIF charge falls below a threshold voltage. A third transmitting operation transmits an axon STDP pulse on a conductive axon STDP line. A second switching operation switches on a STDP transistor by the axon STDP pulse. The STDP transistor provides an electrical path for the dendrite STDP pulse through the programmable resistive memory element when the axon STDP line transmits the axon STDP pulse.

5 Claims, 9 Drawing Sheets

(56) References Cited

U.S. PATENT DOCUMENTS

2005/0015351 A1\* 1/2005 Nugent .................. G06N 3/063
                                                    706/33
2012/0084241 A1\* 4/2012 Friedman ............... G06N 3/049
                                                    706/27

\* cited by examiner

NEUROMORPHIC MEMORY CIRCUIT USING A DENDRITE LEAKY INTEGRATE AND FIRE (LIF) CHARGE

CROSS-REFERENCE TO RELATED APPLICATIONS

This application is a continuation of and claims priority under 35 U.S.C. §120 to U.S. patent application Ser. No. 14/596,223, filed Jan. 14, 2015, titled "NEUROMORPHIC MEMORY CIRCUIT", and incorporated herein by reference in its entirety.

BACKGROUND

This invention relates generally to memory circuits, and more particularly to a neuromorphic memory circuit for neuromorphic applications.

The term "neuron" was coined by Heinrich Wilhelm Gottfried von Waldeyer-Hartz in 1891 to capture the discrete information processing units of the brain. The junctions between two neurons were termed "synapses" by Sir Charles Sherrington in 1897. Information flows only along one direction through a synapse, thus we talk about a "presynaptic" and a "postsynaptic" neuron. Neurons, when activated by sufficient input received via synapses, emit "spikes" that are delivered to those synapses that the neuron is presynaptic to.

It is theorized that experiences are captured as conductance of the synapses in the brain. The synaptic conductance changes with time as a function of the relative spike times of presynaptic and post-synaptic neurons. The conductance of a synapse increases if a postsynaptic neuron fires after its pre-synaptic neuron fires, and decreases in conductance if the order of the two firings is reversed. Furthermore, the change depends on the precise delay between the two events, such that the more the delay, the less the magnitude of change.

Neuromorphic systems, also referred to as artificial neural networks, are computational systems that permit electronic systems to essentially function in a manner analogous to that of biological brains. Neuromorphic systems do not generally utilize a traditional digital model of manipulating 0s and 1s. Instead, neuromorphic systems create connections between processing elements that are roughly functionally equivalent to neurons of a biological brain. Neuromorphic systems may include various electronic circuits that model biological neurons.

BRIEF SUMMARY

Accordingly, one example aspect of the present invention is a neuromorphic memory circuit. The neuromorphic memory circuit includes a programmable resistive memory element, a conductive axon leaky integrate and fire (LIF) line configured to transmit an axon LIF pulse, and a conductive dendrite LIF line configured to build up a dendrite LIF charge over time. A first transistor is electrically coupled to the dendrite LIF line and the programmable resistive memory element. The first transistor provides a discharge path for the dendrite LIF charge through the programmable resistive memory element when the axon LIF line transmits the axon LIF pulse. A conductive axon spike timing dependent plasticity (STDP) line is configured to transmit an axon STDP pulse. The axon STDP pulse is longer than the axon LIF pulse. A conductive dendrite STDP line is configured to transmit a dendrite STDP pulse after voltage at the dendrite LIF line falls below a threshold voltage. A second transistor is electrically coupled to the axon STDP line and the programmable resistive memory element. The second transistor provides an electrical path for the dendrite STDP pulse through the programmable resistive memory element when the axon STDP line transmits the axon STDP pulse.

Another example aspect of the present invention is a neuromorphic memory circuit comprising a memory cell array. Each memory cell in the memory cell array includes a programmable resistive memory element, a conductive axon LIF line configured to transmit an axon LIF pulse, and a conductive dendrite LIF line configured to build up a dendrite LIF charge over time. The axon LIF line is electrically coupled to a column of memory cells in the memory cell array. The dendrite LIF line is electrically coupled to a row of memory cells in the memory cell array. A first transistor is electrically coupled to the dendrite LIF line and the programmable resistive memory element. The first transistor provides a discharge path for the dendrite LIF charge through the programmable resistive memory element when the axon LIF line transmits the axon LIF pulse. A conductive axon STDP line is configured to transmit an axon STDP pulse, and a conductive dendrite STDP line is configured to transmit a dendrite STDP pulse after the dendrite LIF charge falls below a threshold voltage. The axon STDP pulse is longer than the axon LIF pulse. Furthermore, the axon STDP line is electrically coupled to the column of memory cells in the memory cell array, and the dendrite STDP line is electrically coupled to the row of memory cells in the memory cell array. A second transistor is electrically coupled to the axon STDP line and the programmable resistive memory element. The second transistor provides an electrical path for the dendrite STDP pulse through the programmable resistive memory element when the axon STDP line transmits the axon STDP pulse.

Yet another example aspect of the present invention is a method for operating a neuromorphic memory circuit. The method includes accumulating a dendrite LIF charge over time on a conductive dendrite LIF line. A first transmitting operation transmits an axon LIF pulse on a conductive axon LIF line. A first switching operation switches on a LIF transistor by the axon LIF pulse such that the LIF transistor provides a discharge path for the dendrite LIF charge through a programmable resistive memory element when the axon LIF line transmits the axon LIF pulse. A second transmitting operation transmits a dendrite STDP pulse if the dendrite LIF charge falls below a threshold voltage. A third transmitting operation transmits an axon STDP pulse on a conductive axon STDP line. A second switching operation switches on a STDP transistor by the axon STDP pulse. The STDP transistor provides an electrical path for the dendrite STDP pulse through the programmable resistive memory element when the axon STDP line transmits the axon STDP pulse.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION

The present invention is described with reference to embodiments of the invention. Throughout the description of the invention reference is made to FIGS. 1-8B. When referring to the figures, like structures and elements shown throughout are indicated with like reference numerals.

A neuron behavior model may include a presynaptic neuron connected to a postsynaptic neuron via a synapse. The following variables can be defined:

$V_{pre}(t)$ is a membrane potential of presynaptic neuron (as a function of time).

$V_{post}(t)$ is a membrane potential of postsynaptic neuron (as a function of time).

w is a synaptic weight. Synaptic weight is the influence that a pre-synaptic firing will have on post-synaptic neuron. Synaptic weights are plastic or adaptive, and change through time. Synaptic weight exhibits two forms of plasticity: (a) long-term and (b) short-term. Long-term changes in the transmission properties of synapses provide a physiological substrate for learning and memory, whereas short-term changes support a variety of computations. The mechanism of short-term plasticity is a form of gain control.

$t_{pre}$ is a time when presynaptic neuron fires.

$t_{post}$ is a time when postsynaptic neuron fires.

Furthermore, the behavior model defines two functions:

Leaky integrate and fire (LIF) is a function that determines the $V_{post}$ of the cell body. When the presynaptic neuron fires, $\Delta V_{post}$ is proportional to w.

Spike timing dependent plasticity (STDP) is a function that determines w. $\Delta w$ is a function of $\Delta t$ ($t_{post}-t_{pre}$). In other words, $\Delta w$ is a function of the timing difference between postsynaptic and presynaptic neuron firing. In STDP, synapses are only strengthened if the firing of their pre-synaptic neuron precede, and thus could have contributed to, the firing of the post synaptic neuron. Accidental, non-causal coincidences will weaken synapses.

As discussed in detail below, the memory array structure contemplated by embodiments of the present invention separates LIF and STDP functionality into two different circuit paths. In the two transistor, one resistor (2T-1R) structure, one transistor is used for LIF functionality and the other transistor is used for STDP functionality. By doing so, different pulse lengths can be used for LIF and STDP operations. Specifically, a first transistor is coupled to a relatively long STDP pulse and a second transistor is coupled to a relatively short LIF pulse.

Figure 1:
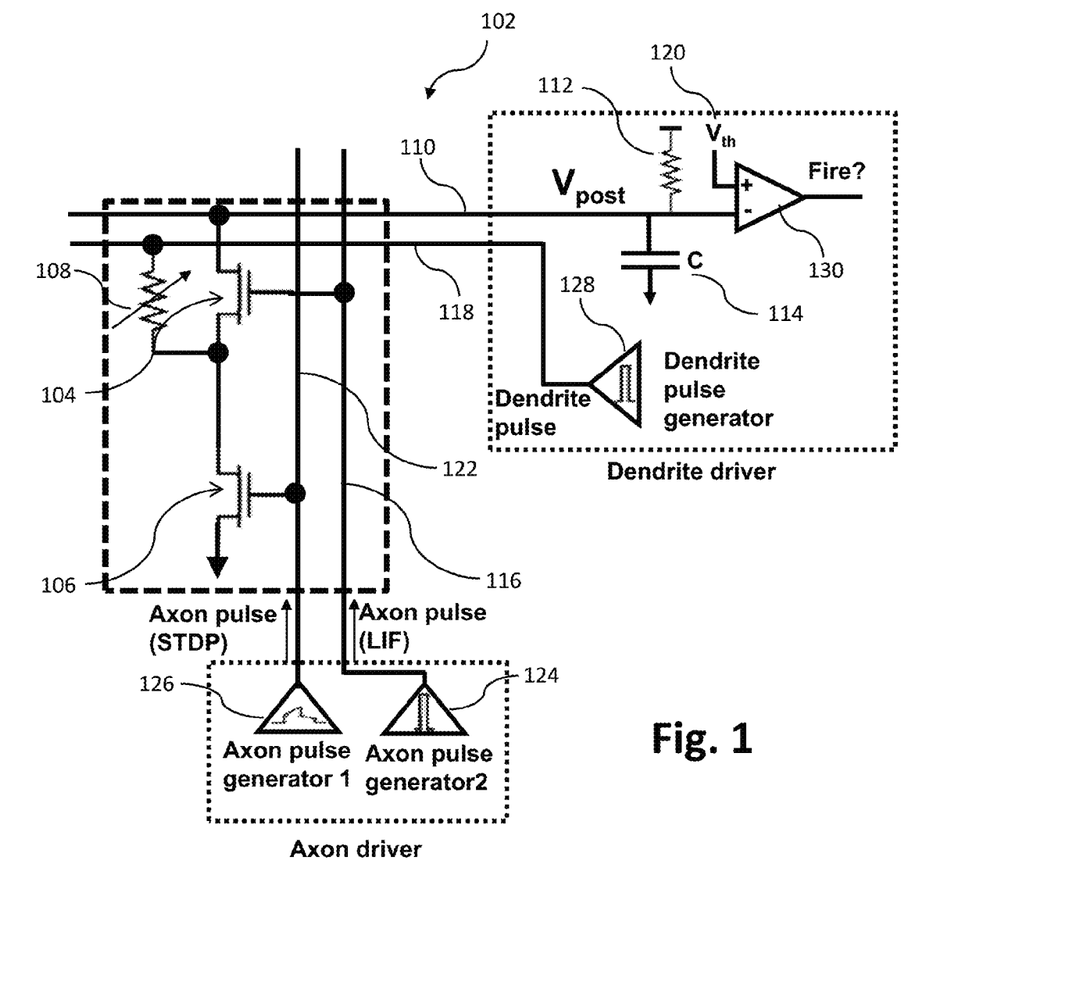
FIG. 1 shows a two transistor, one resistor (2T-1R) memory circuit contemplated by one embodiment of the present invention.

FIG. 1 shows a two transistor, one resistor (2T-1R) memory circuit 102 contemplated by one embodiment of the present invention. The circuit 102 includes a first transistor 104, a second transistor 106 and a programmable resistive memory element 108.

A conductive dendrite LIF line 110 is configured to build up a dendrite LIF charge over time. In one embodiment, the circuit 102 includes a leak resistor 112 coupled to a source voltage and an integration capacitor 114 coupled to the leak resistor 112. The integration capacitor 114 is configured to build up the dendrite LIF charge over time.

Figure 2:
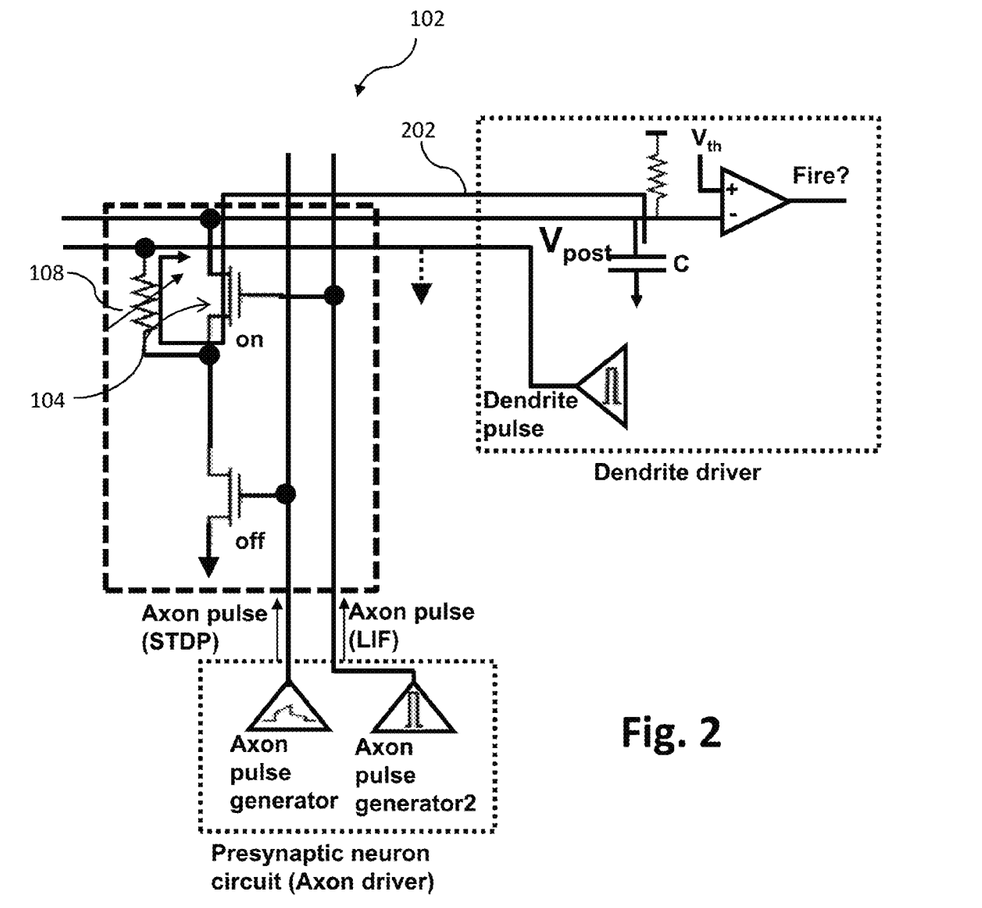
FIG. 2 shows a discharge path for a dendrite LIF charge through a programmable resistive memory element to ground when an axon LIF line transmits an axon LIF pulse.

A conductive axon LIF line 116 is configured to transmit an axon LIF pulse. The first transistor 104 is electrically coupled to the dendrite LIF line 112 and the programmable resistive memory element 108. As shown in FIG. 2, the first transistor 104 provides a discharge path 202 for the dendrite LIF charge through the programmable resistive memory element 108 to ground when the axon LIF line 116 transmits the axon LIF pulse.

Figure 3:
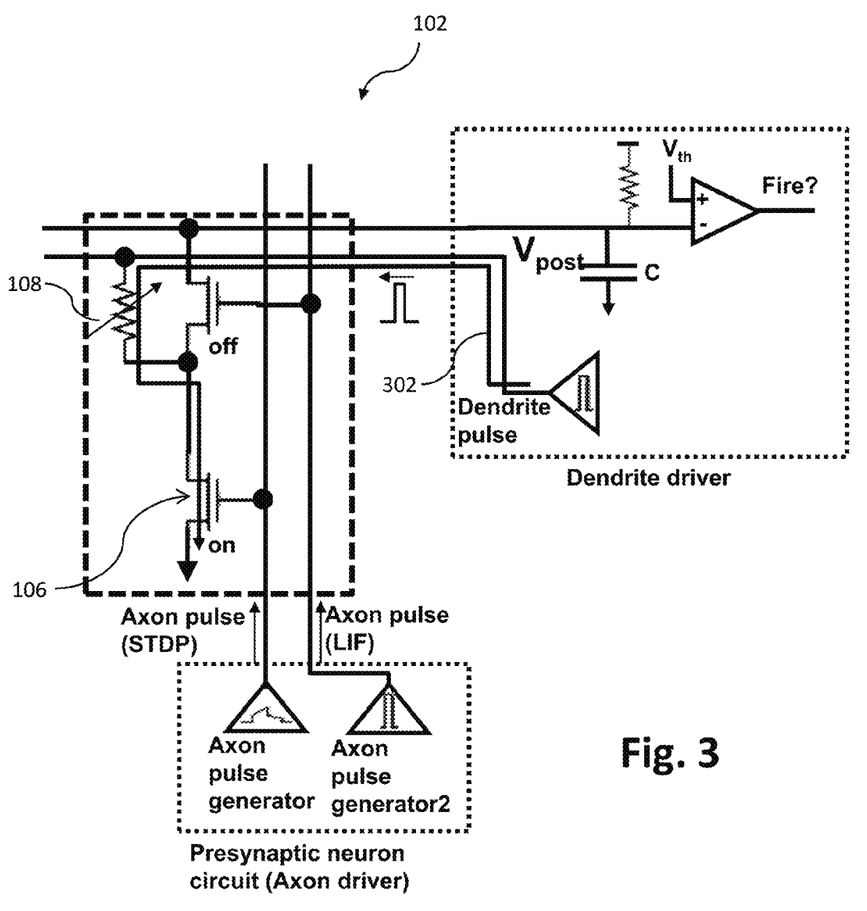
FIG. 3 shows an electrical path for a dendrite STDP pulse through the programmable resistive memory element to ground when an axon STDP line transmits an axon STDP pulse.

Returning to FIG. 1, the memory circuit 102 further includes a conductive dendrite STDP line 118 for transmitting a dendrite STDP pulse after voltage at the dendrite LIF line falls below a threshold voltage 120. A conductive axon STDP line 122 is configured to transmit an axon STDP pulse. As detailed below, the axon STDP pulse is longer than the axon LIF pulse. The second transistor 106 is electrically coupled to the axon STDP line 122 and the programmable resistive memory element 108. As illustrated in FIG. 3, the second transistor 106 provides an electrical path 302 for the dendrite STDP pulse through the programmable resistive memory element 108 to ground when the axon STDP line transmits the axon STDP pulse.

As shown in FIG. 1, the memory circuit 102 may further include an axon LIF pulse generator 124 for generating the axon LIF pulse, and an axon STDP pulse generator 126 for generating the axon STDP pulse. The axon LIF pulse generator 124 is electrically coupled to the conductive axon LIF line 116. The axon STDP pulse generator 126 is electrically coupled to the conductive axon STDP line 122. The memory circuit 102 may further include a dendrite STDP pulse generator 128 for generating the dendrite STDP pulse. The dendrite STDP pulse generator 128 is electrically coupled to the dendrite STDP line 118.

In one embodiment, the programmable resistive memory element 108 includes a phase change material. In phase change memory, information is generally stored in materials that can be manipulated into different phases. Each of these phases exhibit different electrical properties which can be used for storing information. The amorphous and crystalline phases are typically two phases used for bit storage (1's and 0's) since they have detectable differences in electrical resistance. Specifically, the amorphous phase (also referred to as the reset state) has a higher resistance than the crystalline phase (also referred to as the set state).

In a particular embodiment, the phase change material is composed of $Ge_xSb_yTe_z$, where a Ge atomic concentration x is within a range from 30% to 70%, a Sb atomic concentration y is within a range from 10% to 30%, and a Te atomic concentration z is within a range from 20% to 50%. The phase change material may include an initial state with an initial electrical resistance between the set electrical resistance and the reset electrical resistance. Furthermore, the initial state is at a lower potential energy than the set state and the reset state such that the electrical resistance of the phase change material programmed to either the set state or the reset state drifts toward the initial electrical resistance over time. In other words, the set and reset states are metastable states, and the initial state is the ground state.

The memory circuit 102 may further include a comparator 130 electrically coupled to the dendrite LIF line 110 and the threshold voltage 120. The comparator 130 is configured to compare the voltage at the dendrite LIF line 110 and the threshold voltage 120 to determine whether the dendrite driver should fire the dendrite STDP pulse. If the comparator 130 detects that voltage at the dendrite line is below the threshold voltage 120, it causes the dendrite STDP pulse generator 128 to transmit the dendrite STDP pulse.

Figure 4:
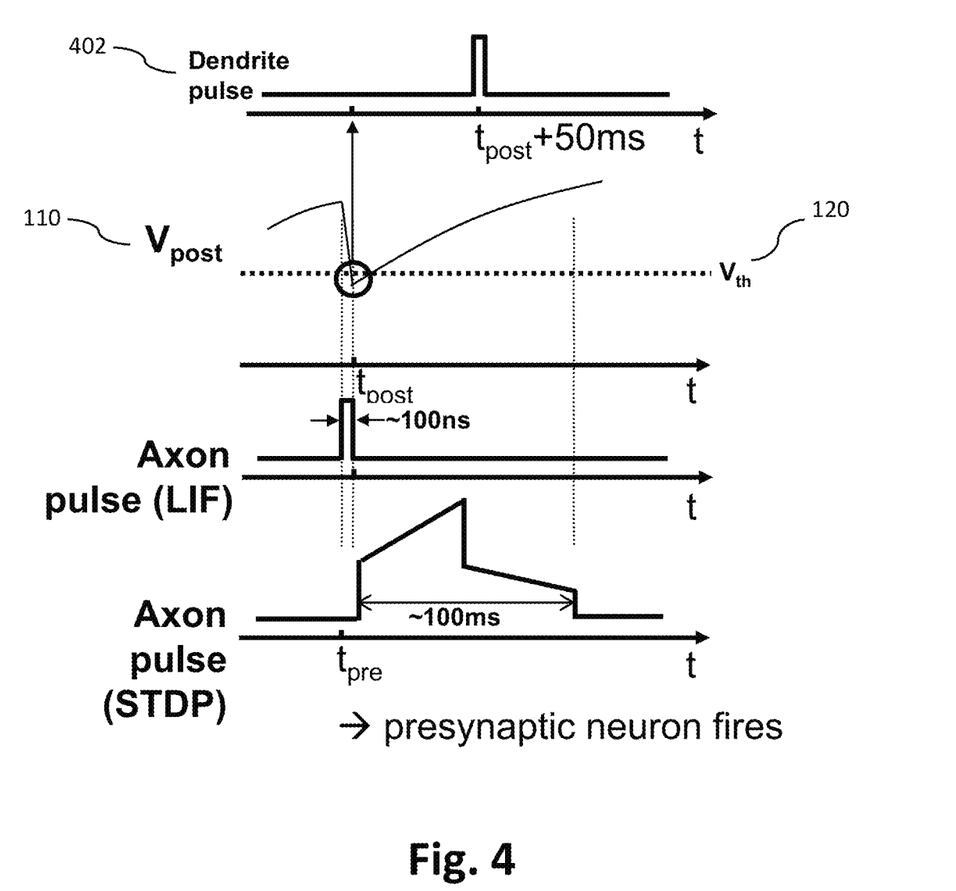
FIG. 4 shows a dendrite LIF line ($V_{post}$) falling below a threshold voltage 120 at time $t_{post}$.

For example, in FIG. 4, the dendrite LIF line 110 ($V_{post}$) is shown falling below the threshold voltage 120 ($V_{th}$) at time $t_{post}$. As a result, the dendrite STDP pulse generator 128 transmits the dendrite STDP pulse 402 at time $t_{post}$+50 ms. As mentioned above, the axon STDP pulse is longer than the axon LIF pulse. In a particular embodiment, the axon LIF pulse is approximately 100 ns and the axon STDP pulse is approximately 100 ms. It is noted that pulse timings shown in FIG. 4 are for illustration purposes only and may be adjusted without departing from the scope of the present invention.

As shown, the axon STDP pulse magnitude significantly decreases approximately half way through the pulse ($t_{pre}$+50 ms). Thus, if $\Delta t$ ($t_{post}-t_{pre}$)>0, the dendrite STDP pulse is transmitted during the lower magnitude portion of the axon STDP pulse and the phase change material is programmed toward the lower-resistance, set state. If $\Delta t$ ($t_{post}-t_{pre}$)<0, the dendrite STDP pulse is transmitted during the higher magnitude portion of the axon STDP pulse and the phase change material is programmed toward the higher-resistance, reset state. In this manner, the memory element simulates synapses that are strengthened if the firing of their presynaptic neuron precede the firing of the postsynaptic neuron, and weakened if the firing of their presynaptic neuron follow the firing of the postsynaptic neuron.

Figure 5:
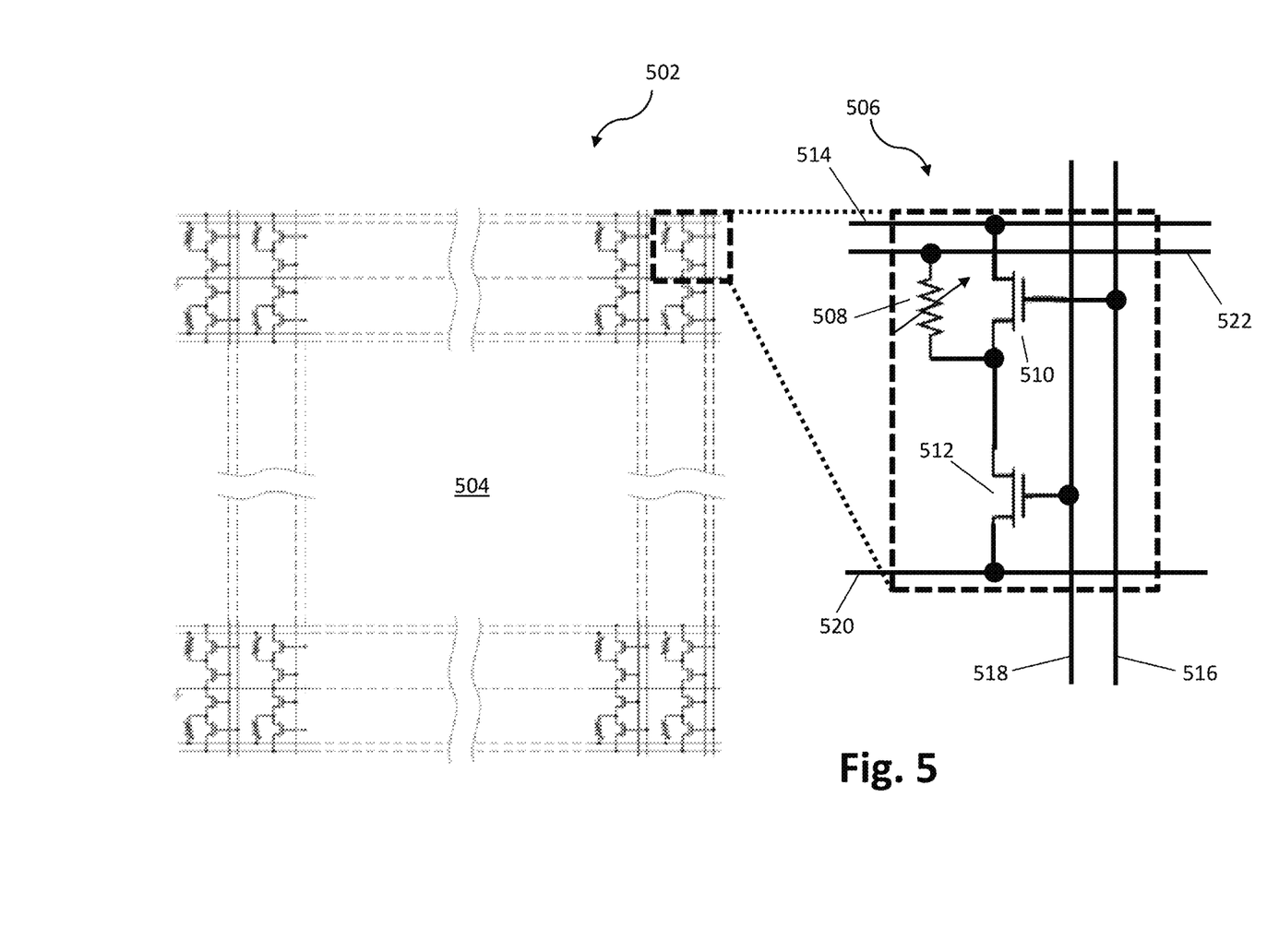
FIG. 5 shows an embodiment of a neuromorphic memory circuit with a memory array structure, as contemplated by the present invention.

FIG. 5 shows one embodiment of a neuromorphic memory circuit 502 with a memory array structure 504, as contemplated by the present invention. Each unit memory cell 506 in the memory cell array includes a programmable resistive memory element 508, a first transistor 510, and a second transistor 512.

The first transistor 510 is electrically coupled to the dendrite LIF line 514 and the programmable resistive memory element 508. As discussed above, the first transistor 510 provides a discharge path for the dendrite LIF charge through the programmable resistive memory element 508 when the axon LIF line 516 transmits the axon LIF pulse. The second transistor 512 is electrically coupled to the axon STDP line 518 and the programmable resistive memory element 508. As discussed above, the second transistor 512 provides an electrical path for the dendrite STDP pulse through the programmable resistive memory element 508 when the axon STDP line 518 transmits the axon STDP pulse. The unit memory cell 506 may use various types of transistors, including field-effect transistors (FETs) and bipolar junction transistors (BJTs).

The electrical path for the dendrite STDP pulse through the programmable resistive memory element 508 when the axon STDP line 518 transmits the axon STDP pulse may be to a common source line 520. In one embodiment, the common source line is at ground voltage. Furthermore, the unit memory cells 506 may be mirrored vertically in every other row, as shown.

As discussed above, the programmable resistive memory element 508 may include a phase change material. In one embodiment, the phase change material has an electrical resistance and is programmable to a set state having a set electrical resistance and reset state having a reset electrical resistance at least a factor of 10 greater than the set electrical resistance. The phase change material includes an initial state having an initial electrical resistance between the set electrical resistance and the reset electrical resistance. The initial state is at a lower potential energy than the set state and the reset state such that the electrical resistance of the phase change material programmed to the set state or the reset state drifts toward the initial electrical resistance over time. Thus, in a particular embodiment, the resistance of the memory cell is inversely proportional to the synaptic weight.

In the memory array structure 504, the axon LIF lines 516 and the axon STDP lines 518 are electrically coupled to columns of memory cells. The dendrite LIF lines 514 and the dendrite STDP lines 522 are electrically coupled to rows of memory cells.

Figure 6:
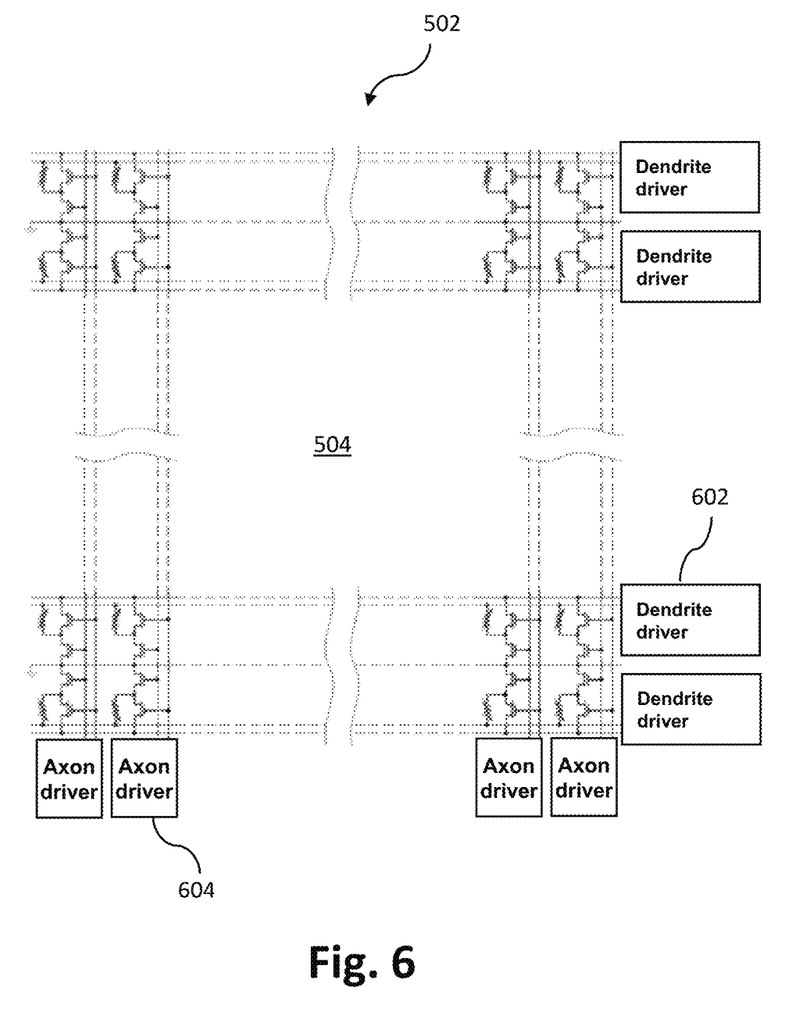
FIG. 6 shows an embodiment of a neuromorphic memory circuit with a plurality of dendrite drivers and axon drivers, as contemplated by the present invention.

FIG. 6 shows one embodiment of a neuromorphic memory circuit 502 with a plurality of dendrite drivers 602 and axon drivers 604. Each dendrite driver 602 is coupled to a row of unit memory cells. Each axon driver 604 is coupled to a column of unit memory cells.

The axon driver 604 provides two functions. First, the axon driver 604 drives the axon STDP line 518 to program the resistive memory element 508 according to the STDP algorithm. Second, the axon driver 604 drives the axon LIF line 516 when the presynaptic neuron fires. Each axon driver 604 may include an axon LIF pulse generator for generating the axon LIF pulse and an axon STDP pulse generator for generating the axon STDP pulse. The axon LIF pulse generator is electrically coupled to the conductive axon LIF line 516, and the axon STDP pulse generator is electrically coupled to the conductive axon STDP line 518.

Each dendrite driver 602 provides two functions. First, the dendrite driver 602 drives the dendrite STDP line to program the resistive memory element 508 according to STDP algorithm. Second, the dendrite driver 602 receives signal from the dendrite LIF line 514 and integrates it to determine whether the dendrite driver should fire a dendrite STDP pulse. Each dendrite driver 602 may include a leak resistor coupled to a source voltage and an integration capacitor coupled to the leak resistor. The integration capacitor is configured to build up the dendrite LIF charge over time. The dendrite driver 602 further includes a dendrite STDP pulse generator for generating the dendrite STDP pulse. The dendrite STDP pulse generator is electrically coupled to the dendrite STDP line. A comparator in the dendrite driver 602 is electrically coupled to the dendrite LIF line and the threshold voltage. The comparator is configured to compare voltage at the dendrite LIF line and the threshold voltage to determine whether the dendrite driver should fire a dendrite STDP pulse.

Figure 7:
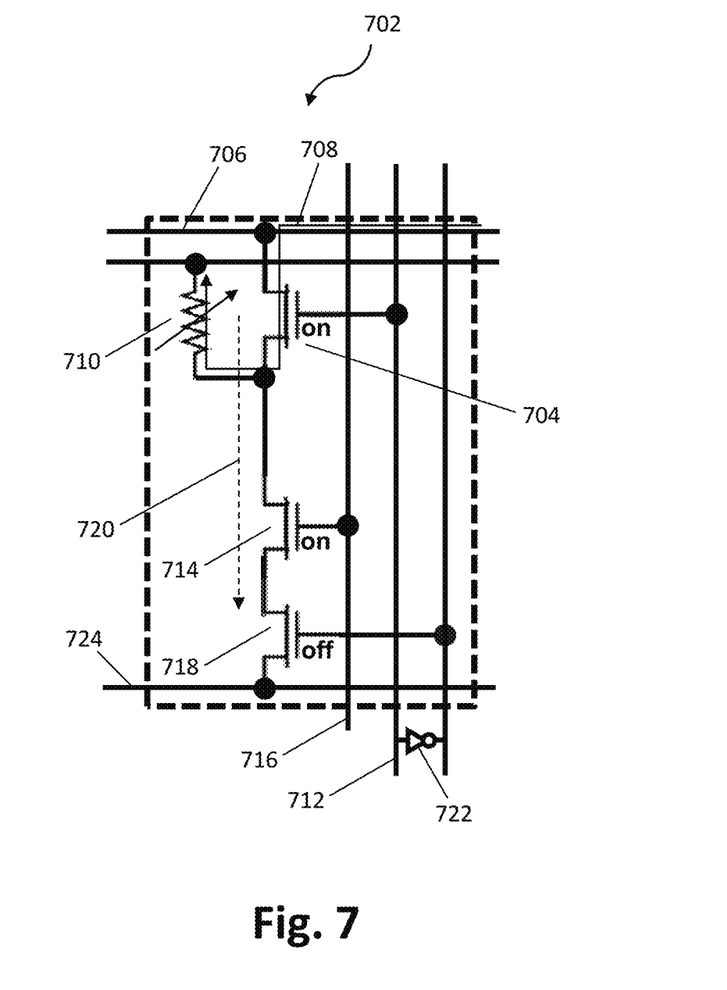
FIG. 7 shows one embodiment of a three transistor, one resistor (3T-1R) unit memory cell contemplated by the present invention.

FIG. 7 shows one embodiment of a three transistor, one resistor (3T-1R) unit memory cell 702 contemplated by the present invention. A first transistor 704 provides a discharge path 708 for the dendrite LIF charge on the dendrite LIF line 706 through the programmable resistive memory element 710 when the axon LIF line 712 transmits the axon LIF pulse. A second transistor 714 provides an electrical path for the dendrite STDP pulse through the programmable resistive memory element 710 when the axon STDP line 716 transmits the axon STDP pulse.

A third transistor 718 is placed in series circuit with the second transistor 714. The third transistor 718 is configured to prevent creation of the discharge path 720 for the dendrite LIF charge through both the first transistor 704 and the second transistor 714. In one embodiment, an inverter 722 is configured to turn off the third transistor 718 when the first transistor 704 is turned on. Thus, the third transistor 718 acts as a collision avoidance transistor between the common source line 724 and the first transistor 704.

Figure 8A:
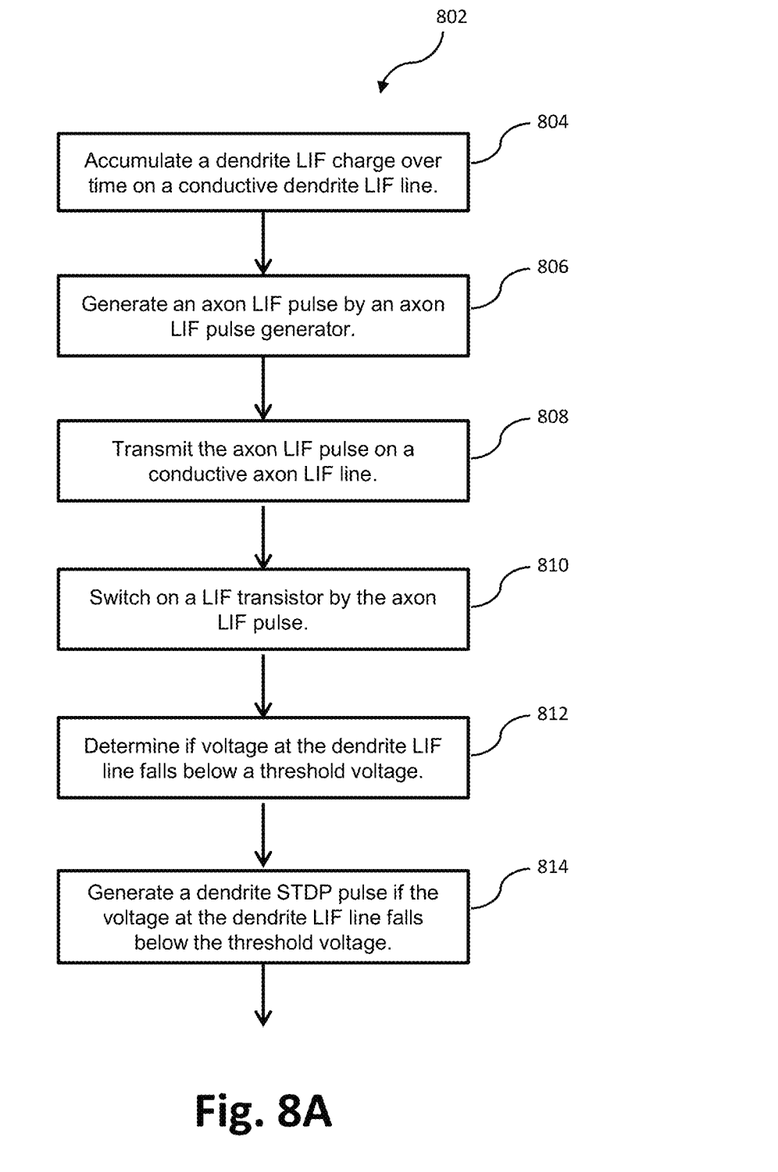
FIGS. 8A and 8B show an example method for operating a neuromorphic memory circuit contemplated by the present invention.
Figure 8B:
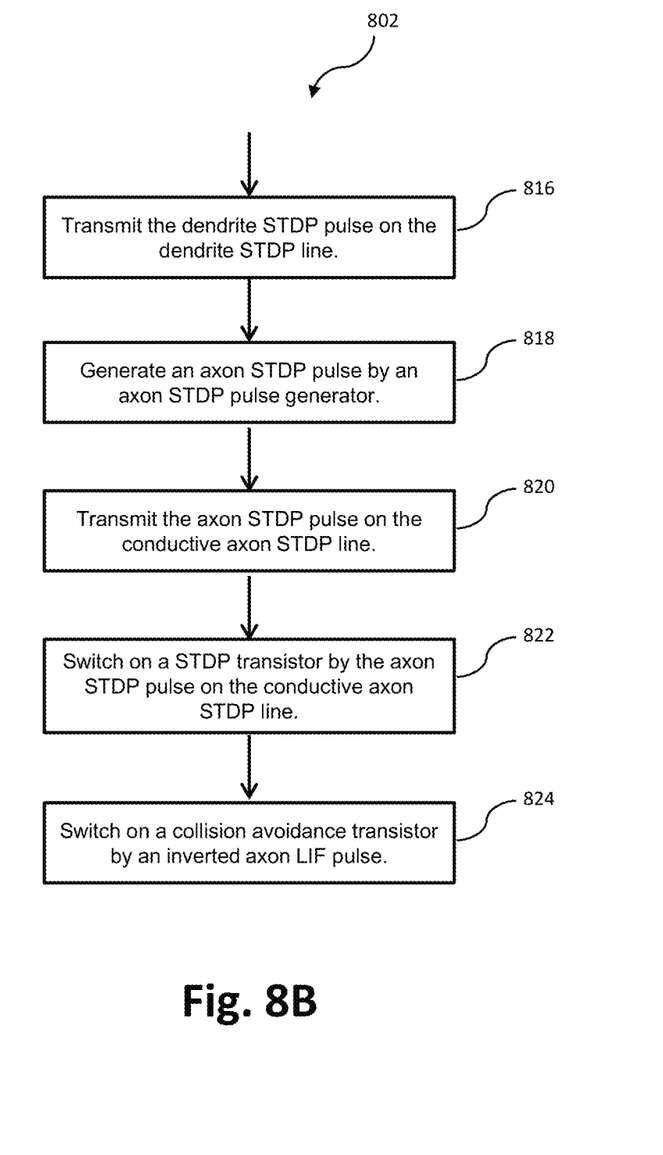

FIGS. 8A and 8B show an example method 802 for operating a neuromorphic memory circuit contemplated by the present invention. The method steps are shown in chronological order for illustration purposes only. Operations may execute concurrently and/or in a different order than illustrated without departing from the spirit and scope of the present invention.

The method 802 includes an accumulating operation 804 for accumulating a dendrite LIF charge over time on a conductive dendrite LIF line. In one embodiment, the accumulate operation 804 is achieved with a leak resistor and integration capacitor electrically coupled to the dendrite LIF line. The leak resistor and integration capacitor build up charge on the conductive dendrite LIF line at an RC time constant. The conductive dendrite LIF line may be electrically coupled to a row of memory cells. The accumulating operation 804 is followed by generating operation 806.

At generating operation 806, an axon LIF pulse is generated by an axon LIF pulse generator. In a particular embodiment, the axon LIF pulse is approximately 100 ns long. The generating operation 806 is followed by transmitting operation 808.

At transmitting operation 808, the axon LIF pulse is transmitted on a conductive axon LIF line. In one embodiment of the invention, the conductive axon LIF line is electrically coupled to a column of memory cells. The transmitting operation 808 is followed by switching operation 810.

At switching operation 810, a LIF transistor is switched on by the axon LIF pulse such that the LIF transistor provides a discharge path for the dendrite LIF charge through a programmable resistive memory element when the axon LIF line transmits the axon LIF pulse. In a particular embodiment of the invention, the programmable resistive memory element is a phase change memory element. The switching operation 810 is followed by determining operation 812.

At determining operation 812, voltage at the dendrite LIF line is compared to a threshold voltage. In one embodiment, a comparator is electrically coupled to the conductive dendrite LIF line and the threshold voltage and determines if voltage at the dendrite LIF line falls below the threshold voltage. The determining operation 812 is followed by generating operation 814.

At generating operation 814, a dendrite STDP pulse is generated if voltage at the dendrite LIF line falls below the threshold voltage. In one embodiment of the invention, the dendrite STDP pulse is generated by a dendrite STDP pulse generator electrically coupled to the dendrite STDP line. The generating operation 814 is followed by transmitting operation 816.

At transmitting operation 816, the dendrite STDP pulse is transmitted on the dendrite STDP line. In one embodiment, the dendrite STDP line is electrically coupled to the column of memory cells. The transmitting operation 816 is followed by generating operation 818.

At generating operation 818, an axon STDP pulse is generated by an axon STDP pulse generator. The axon STDP pulse generator is electrically coupled to a conductive axon STDP line. In one embodiment of the invention, the conductive axon STDP line is electrically coupled to the column of memory cells. The generating operation 818 is followed by transmitting operation 820.

At transmitting operation 820, the axon STDP pulse is transmitted on the conductive axon STDP line. In one embodiment of the invention, the conductive axon STDP line is electrically coupled to the column of memory cells. The transmitting operation 820 is followed by switching operation 822.

At switching operation 822, a STDP transistor is switched on by the axon STDP pulse. The STDP transistor provides an electrical path for the dendrite STDP pulse through the programmable resistive memory element when the axon STDP line transmits the axon STDP pulse. The switching operation 822 is followed by switching operation 824.

At switching operation 824, a collision avoidance transistor is switched on by an inverted axon LIF pulse such that when the LIF transistor is switched on, the collision avoidance transistor is switched off (i.e., transistor is operated in the cutoff region). This operation may include an inverting operation to invert the axon LIF pulse by an inverter to generate the inverted axon LIF pulse, and a preventing operation to prevent creation of the discharge path for the dendrite LIF charge through both the LIF transistor and the STDP transistor by the collision avoidance transistor in series circuit with the STDP transistor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

As will be appreciated by one skilled in the art, aspects of the present invention may be embodied as a system, method or computer program product. Accordingly, the present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. A method for operating a neuromorphic memory circuit, the method comprising:
   accumulating a dendrite leaky integrate and fire (LIF) charge over time on a conductive dendrite LIF line;
   transmitting an axon LIF pulse on a conductive axon LIF line;
   switching on a LIF transistor by the axon LIF pulse such that the LIF transistor provides a discharge path for the dendrite LIF charge through a programmable resistive memory element when the axon LIF line transmits the axon LIF pulse;
   transmitting a dendrite spike timing dependent plasticity (STDP) pulse if voltage at the dendrite LIF line falls below a threshold voltage;
   transmitting an axon STDP pulse on a conductive axon STDP line;
   switching on a STDP transistor by the axon STDP pulse, the STDP transistor providing an electrical path for the dendrite STDP pulse through the programmable resistive memory element when the axon STDP line transmits the axon STDP pulse.

2. The method of claim 1, further comprising determining if the voltage at the dendrite LIF line falls below a threshold voltage by a comparator electrically coupled to the conductive dendrite LIF line and the threshold voltage.

3. The method of claim 1, further comprising:
   generating the axon LIF pulse by an axon LIF pulse generator electrically coupled to the conductive axon LIF line;
   generating the axon STDP pulse by an axon STDP pulse generator electrically coupled to the conductive axon STDP line; and generating the dendrite STDP pulse by a dendrite STDP pulse generator electrically coupled to the dendrite STDP line.

4. The method of claim 1, further comprising preventing creation of the discharge path for the dendrite LIF charge through both the LIF transistor and the STDP transistor by a collision avoidance transistor in series circuit with the STDP transistor.

5. The method of claim 4, further comprising:
inverting the axon LIF pulse to generate an inverted axon LIF pulse; and
switching the collision avoidance transistor by the inverted axon LIF pulse such that when the LIF transistor is switched on, the collision avoidance transistor is switched off.

* * * * *